United States Patent [19]

Carter et al.

[11] Patent Number: 5,633,034
[45] Date of Patent: May 27, 1997

[54] PROCESS FOR FORMING A CIRCUIT ASSEMBLY

[75] Inventors: Kenneth R. Carter; Richard A. DiPietro, both of San Jose; James L. Hedrick, Pleasanton, all of Calif.; John P. Hummel, Millbrook, N.Y.; Robert D. Miller, San Jose, Calif.; Martha I. Sanchez, Menlo Park, Calif.; Willi Volksen, San Jose, Calif.; Do Y. Yoon, Los Gatos, Calif.

[73] Assignee: International Business Machines Corporation, Armonk, N.Y.

[21] Appl. No.: 645,019

[22] Filed: May 9, 1996

[51] Int. Cl.$^6$ .................... B05D 5/12; C08G 69/14
[52] U.S. Cl. .................. 427/96; 427/385.5; 528/310; 528/332; 528/503
[58] Field of Search .................. 427/96, 385.5, 427/402; 528/310, 315, 397, 401, 332, 503

[56] References Cited

U.S. PATENT DOCUMENTS

| | | | |
|---|---|---|---|
| 4,656,050 | 4/1987 | Araps et al. | 427/12 |
| 4,845,167 | 7/1989 | Alston et al. | 528/353 |
| 4,912,238 | 3/1990 | Alston et al. | 552/101 |
| 5,219,639 | 6/1993 | Sugawara et al. | 428/209 |
| 5,302,851 | 4/1994 | Ree et al. | 257/702 |

OTHER PUBLICATIONS

M. E. Rogers et al., "Semicrystalline and Amorphous Fluorine–Containing Polyimides", Polymer, 1993, vol. 34, No. 4, pp. 849–855.

B. Luther et al., "Planar Copper–Polyimide Back End of the Line Interconnections for ULSI Devices", X VLSI Multilevel Interconnection Conference, Santa Clara, pp. 15–21 (1993).

*Primary Examiner*—Shrive Beck
*Assistant Examiner*—Brian K. Talbot
*Attorney, Agent, or Firm*—Robert B. Martin

[57] ABSTRACT

The invention relates to a process for forming a circuit assembly comprising (i) coating onto a substrate a layer of polyamic ester selected from a unique class of polyamic esters; (ii) imidizing the polyamic ester to form a layer of polyimide having an even surface and (iii) forming circuit conductors on the even surface of the polyimide.

3 Claims, No Drawings

PROCESS FOR FORMING A CIRCUIT ASSEMBLY

FIELD OF THE INVENTION

The present invention relates to an improved process for forming a circuit assembly on a substrate.

BACKGROUND OF THE INVENTION

Polyimides are known in the art for use in the manufacture of circuit assemblies such as integrated circuit chips and multichip modules. For example, Dawson et al. U.S. Pat. No. 5,420,232 discloses the use of a class of polyimides in the manufacture of electronic components. Polyimides are useful in forming dielectric layers, passivation layers, alpha particle barriers and stress buffers. Polyimides are also useful as a dielectric material to insulate the conductor wiring in multilayer circuit assemblies such as the back end of the line of integrated circuit chips and multichip modules. A multichip module is an intermediate level of packaging between the chips and the circuit board. Multichip modules are made up of a plurality of insulating and conducting layers wherein the conducting power, signal and ground layers deliver power to the chips and distribute the input/output signals between chips on the module or to/from the circuit board. Multichip modules typically contain input/output pins on the bottom surface for connection to the circuit board. Polyimides have also been utilized as insulating layers on integrated circuit chips especially in the back end of the line with the input/output circuitry of the chip. It is important that the polyimide have low and isotropic dielectric constant to avoid signal crosstalk. Also, it is important that the polyimide have improved planarization properties to enable it use on uneven substrates having uneven topography to provide a level surface for subsequent circuit formation. Further, the polyimide should have high thermal stability to enable the use of advanced processing techniques which operate at a higher temperature.

It is therefore an object of the present invention to provide an improved process for forming a circuit assembly with a unique class of polyimides.

Other objects and advantages will be apparent from the following disclosure.

SUMMARY OF THE INVENTION

The present invention relates to a process for forming a circuit assembly comprising (i) coating onto a substrate a layer of polyamic ester selected from a unique class of polyamic esters; (ii) imidizing the polyamic ester to form a layer of polyimide having an even surface and (iii) forming circuit conductors on the even surface of the polyimide. Preferably, the process is used to form a multichip module.

A more thorough disclosure of the present invention is presented in the detailed description which follows.

DETAILED DESCRIPTION OF THE INVENTION

The present invention relates to an improved process for making circuit assemblies. The first step of the process involves coating onto a substrate a polyamic ester selected from a unique class of polyamic esters. Suitable substrates comprise ceramic, polymer, glass, silica or the like. Such substrates generally have an uneven surface due to surface irregularities or circuit conductors formed thereon. The polyamic ester, dissolved in a suitable solvent, is coated onto the surface of the substrate. Suitable polyamic esters for use in the process of the present invention (3F polyamic ester) have the following general repeat unit:

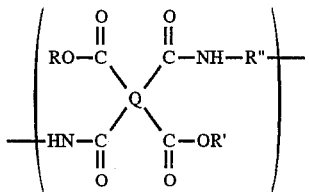

wherein

R and R' are each independently selected from alkyl or aryl and optionally substituted with suitable substituents which do not substantially interfere with the imidization nor adversely affect the final properties of the polyimide. Generally R and R' are the same and are suitably lower $C_1$ to $C_6$ alkyl or haloalkyl, such a methyl, ethyl, or 2,2,2-trifluoroethyl, or the like.

Q with ortho substituents is selected from:

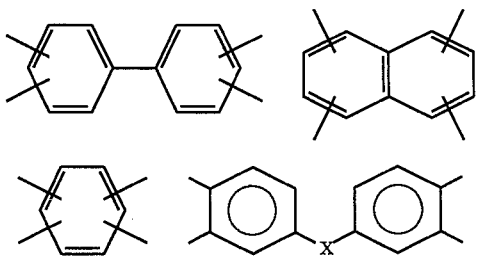

where X is selected from oxygen, carbonyl or $C(CF_3)_2$; and R" is

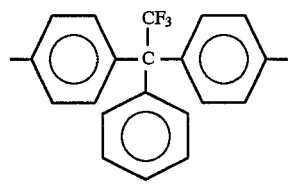

Optionally the aryl rings of R" can be substituted by substituents which do not unacceptably interfere with the unique properties of the polyimide in the present invention such as lower alkyl, halo, hydroxy, alkynyl and phenylalkynyl and these polymers should be contemplated as equivalents of the polymer claimed herein.

The 3F polyamic ester can be conveniently prepared by reacting the diacid chloride ester with diamine in the presence of base to form polyamic ester. The polyamic ester can then be thermally or solution imidized to form 3F polyimide.

The 3F polyamic ester will have a molecular weight Mn of about 5,000 to 50,000 preferably about 20,000 to 35,000.

Suitable solvents for the 3F polyamic ester include cyclohexanone, N-methylpyrrolidone, and preferably gamma butyrolactone. Due to the unique properties of the 3F polyamic ester, the solution formed has (i) a high solid content of about 15 to 50 weight % preferably 20 to 30 weight % and (ii) a low viscosity at temperatures from about 100° to 200° C. Higher solids content is achieved with low molecular weight polyamic ester.

The high solids content in combination with the low viscosity enable the 3F polyamic ester solution to be coated onto an uneven substrate and form an even dielectric surface for subsequent process steps.

The second step of the process of the present invention involves imidization of the 3F polyamic ester to form a layer of 3F polyimide. Imidization is conveniently achieved by heating the 3F polyamic ester to a temperature of about 280° C. to 350° C. to for a period of about 1 to 2 hours. The heating also removes solvent from the polyimide layer. The imidization can be accomplished at lower temperature by catalyzing it with base.

The last step involves forming a circuit line on the even surface of the polyimide layer using standard photolithographic and electroplating techniques. The process of the present invention avoids uneven surface which can cause nonuniform lithographic exposures during circuit formation. The metalized circuit (e.g. Al or Cu) can be formed by electroplating with subsequent patterning with standard photolithographic techniques. Alternatively, the circuits can be formed by chemical vapor deposition, sputtering or the like through a photolithographic pattern on the polyimide.

A preferred embodiment of the process of the present invention relates to forming an integrated circuit packaging structure for mounting on a circuit board and providing signal and power current to one or more integrated circuit chips mounted thereon. The packaging structure comprises (i) a substrate having electrical connecting means for connection to a circuit board (ii) a plurality of alternating electrically insulating and conducting (wiring) layers positioned on the substrate wherein at least one of the insulating layers is formed by the process of the present invention and (iii) a plurality of vias for electrically interconnecting connecting means, conducting layers and integrated circuit chip(s).

The substrate of the packaging structure is generally an inert substrate such as glass, silica or ceramic. The substrate can optionally have integrated circuits disposed therein. The bottom of the substrate is provided with electrical connecting means such as input/out pins (I/O pins) for electrically connecting the packaging structure to the circuit board. A plurality of electrically insulating and electrically conducting layers (layers having conductive circuits disposed in an insulating material) are alternately stacked up on the substrate. The layers are generally formed on the substrate in a layer by layer process wherein each layer is formed in a separate process step. At least one of these layers, comprises 3F polyimide formed by the process of the present invention. The packaging structure also comprises receiving means for receiving one or more integrated circuit chips. Suitable receiving means include pinboards for receipt of chip I/O pins or metal pads for solder connection to the chip. Generally, the packaging structure also comprises a plurality of electrical vias generally vertically aligned to electrically interconnect the I/O pins, the conductive layers and integrated circuit chips disposed in the receiving means. The function, structure and method of manufacture of the integrated circuit packaging structure are well known to those skilled in the art as disclosed in U.S. Pat. Nos. 4,489,364; 4,508,981; 4,628,411 and 4,811,082, the disclosures of which are incorporated herein by reference.

The process for forming the integrated circuit packaging structure generally comprises the steps of: (i) coating a substrate of ceramic, silica, glass or polymer (polyimide) with 3F polyamic ester; (ii) imidizing the 3F polyamic ester to form a layer of polyimide having a flat surface and (iii) forming a circuit line on the surface of the polyimide.

The process of the present invention can also be utilized to form integrated circuit chips. In particular, the process can be utilized in the back end of the line for making input/output circuits on the chip.

The following examples are detailed descriptions of the process of the present invention. The detailed preparations fall within the scope of, and serve to exemplify, the more generally described process set forth above. The examples are presented for illustrative purposes only, and are not intended as a restriction on the scope of the invention.

Preparation of 4,6-dicarbethoxyisophthalic acid
(DADE)

A 250 mL flask equipped with a stirrer, reflux condenser, and heating mantle was charged with 150 mL of dry ethanol. Pyromellitic dianhydride (52.3 g, 0.24 mol) was then added as a solid. The reaction mixture was stirred under argon for 4 hours with gentle heating, during which time the temperature rose to approximately 60° C. and the mixture became homogeneous. Occasionally, true homogeneity does not occur; nonetheless, the reaction goes to completion. When the reaction temperature started to decline, 50 mL of ethyl acetate was added and the mixture was allowed to cool with stirring overnight. The resulting slurry was vacuum filtered to give Crop 1 as a white crystalline solid. The solid was washed once with 15 mL of ethyl acetate and the combined filtrate and wash were slowly evaporated at reduced pressure until turbidity ensued. The suspension was heated to dissolution and allowed to cool slowly to room temperature with stirring. The resulting white crystalline solid was filtered off (Crop 2), washed once with 15 mL of ethyl acetate, and the combined filtrate and washings treated as before. The white, crystalline precipitate was filtered (Crop 3) and washed with 15 mL, of 1:1 ethyl acetate/hexane and 15 mL of hexane. The combined filtrate and washings were once again treated as before. The resulting slurry was filtered (Crop 4) and washed with 15 mL of hexane. The remaining filtrate was discarded. All crops were dried in a vacuum oven overnight at 50° C. (0.2 Torr). HPLC analysis revealed that Crops 1 and 2 were primarily the p-diacid diester and Crops 3 and 4 were primarily the m-isomer. Pure meta isomer can be prepared by recrystallization of Crops 3 and 4 from hexane/ethyl acetate.

Preparation m-dichloro-diethyl pyromellitate

A 250 mL flask equipped with a stirrer, chilled water reflux condenser, addition funnel, and heating mantle was charged with the m-diester diacid (DADE) 23.3 g, 0.075 mol) obtained from Part 1 (above). Ethyl acetate (100 mL) was then added and the reaction mixture was heated to 55°–58° C. Oxalyl chloride (27.3 g, 18.7 mL, 0.215 mol) was slowly added to the reaction mixture (subsurface) over 3–4 hours.

The reaction temperature was maintained at 55°–58° C. for an additional 12 hours. When the reaction was judged complete (HPLC, reactive samples), the batch was cooled, a vacuum was applied to the reactor and the excess oxalyl chloride was removed (along with ethyl acetate) by vacuum distillation (32°–55° C. at 26" Hg). The batch was distilled to a thick syrup and fresh dry ethyl acetate (100 mL) was added via vacuum transfer and the resulting solution again distilled to a thick syrup.

At this point, all of the residual oxalyl chloride had been removed (as determined by the accompanying HPLC method) and the batch was evaporated to a yellowish oil which was crystallized and recrystallized from hexane to yield the m-diacid chloride/diethyl ester in 70–80% yield, mp 53°–55° C.

Preparation of 3F Diamine

To a 1-L 3-necked round bottomed flask equipped with a stir bar, thermocouple, Ar inlet and Dean-Stark condenser was added 54.6 g (0.287 mol) p-toluenesulfonic acid monohydrate and 325 mL of freshly distilled aniline and the mixture refluxed to a constant head temperature (184° C.) with separation water. The Dean-Stark trap was replaced by a regular reflux condenser while the pot temperature was reduced to 130° C. under positive Ar pressure. At this point, 50.0 g (0.287 mol) of 2,2,2-trifluoroacetophenone was added in one portion and the mixture heated at 145° C. with stirring for 48 hrs. The reaction mixture was then cooled to 90° C. and 500 mL of 1N NaOH added in one portion with vigorous stirring. After cooling to room temperature, 1 L of $CH_2Cl_2$ was added with stirring and the layers separated. The aqueous layer was extracted with 150 mL of $CH_2Cl_2$ and the combined organic layers washed sequentially with 4×250 mL of sat. $NaHCO_3$, 4×250 mL of water and 200 mL of brine. The dark solution was dried over $MgSO_4$, evaporated to approximately 300 mL and added slowly to 4 L of stirring hexane. The hexane was decanted and the resulting dark semi-solid taken up in about 500 mL of $CH_2Cl_2$ which was again evaporated to approximately 300 mL and added slowly 4 L of stirring hexane. The suspension was filtered to yield 78 g of a purple-red solid which was, in turn, dissolved in 2 of diethylether and treated with 500 g of silica gel (60–230 mesh) with stirring overnight. The mixture was filtered over Celite, the filtrate concentrated to approximately 125 mL and the product slowly precipitated with stirring into 2 L of hexane. This procedure (resuspension of $SiO_2$, stirring for 1 hr., filtration and precipitation) was repeated a total of 4 times resulting in a total of 68 g of beige powder (subsequent treatments provide exceedingly small amounts of material). This material was taken up 1 L of diethylether and treated with 50 g of silica gel and 5 g of Norit. Processed as above with precipitation into 1 L of hexane ultimately resulted in 63 g of white powder, mp 215°–218° C.

Preparation of 3F Polyamic Ester

To a 1000-mL, 3-necked round bottomed flask equipped with a stir bar, thermowell, Argon inlet and addition funnel was added 88.27 g (0.2578 mol) of 4,4'(2,2,2-trifluoro-1phenylethylidene)-bis-benzeneamine (3F-diamine), (40.8 g 0.516 mol) of anhydrous pyridine and 750 mL of anhydrous NMP. The resulting solution was stirred and cooled to 0.5° C. The addition funnel was then charged with a solution of 89.50 g (0.2578 mol) of m-dichloro-diethylpyromellitate in 100 mL of anhydrous ethyl acetate and the solution slowly added dropwise over 1 hour (temperature <10° C.). The resulting solution was allowed to warm to ambient temperature overnight with stirring under Argon. The batch was then precipitated in 200 mL aliquots into 1800 mL of water under high shear conditions (Waring blender), filtered, washed with water and suspended in 4 L of 10% aqueous IPA (v/v) for at least 3 hours. The batch was filtered, washed with water and resuspended in 4 L of water for at least 3 hours. This process was repeated one more time followed by a final suspension in 4 L of IPA. The batch was filtered and dried in a vacuum oven at 50° C. for 48 hours at house vacuum with a Nitrogen purge followed by 24 hours of <200 torr. The overall yield is 158 g, MW(av) 33K daltons.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A process for forming a circuit assembly comprising
   (i) coating a layer of polyamic ester onto a substrate, the polyamic ester having the repeat unit:

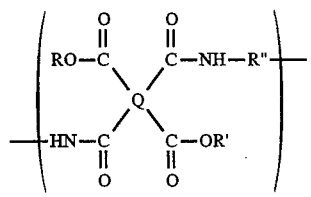

wherein Q is selected from:

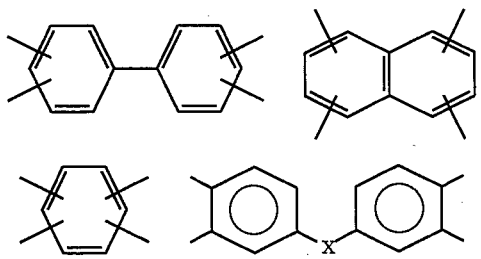

where X is selected from oxygen, carbonyl or $C(CF_3)_2$; R" is:

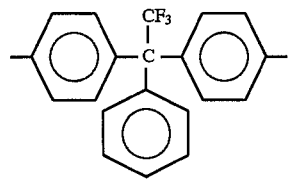

and R and R' are alkyl or haloalkyl;
   (ii) heating the layer to imidize the polyamic ester and form a layer of polyimide; and
   (iii) forming circuit lines on the surface of the layer of polyimide.

2. A process for forming a circuit assembly comprising
   (i) coating a layer of polyamic ester onto a substrate, the polyamic ester having the repeat unit:

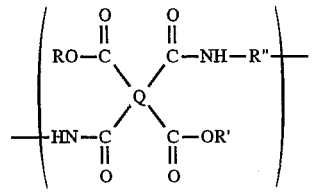

wherein Q is selected from

R" is:
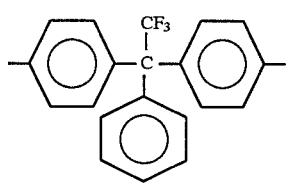
and R and R' are lower alkyl or haloalkyl;
(ii) heating the layer to imidize the polyamic ester and form a layer of polyimide; and
(iii) forming circuit lines on the surface of the layer of polyimide.
3. The process of claim 2 wherein the circuit assembly is a circuit packaging structure.
* * * * *